United States Patent
Chillara et al.

(10) Patent No.: US 6,184,575 B1
(45) Date of Patent: Feb. 6, 2001

(54) ULTRA-THIN COMPOSITE PACKAGE FOR INTEGRATED CIRCUITS

(75) Inventors: Satya Chillara; Shahram Mostafazadeh, both of San Jose, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 08/296,671

(22) Filed: Aug. 26, 1994

(51) Int. Cl.[7] ................................... H01L 23/495
(52) U.S. Cl. .................. 257/692; 257/666; 257/704; 257/701; 257/710; 257/708; 257/787
(58) Field of Search .................. 257/666, 692, 257/704, 710, 701, 787, 708

(56) References Cited

U.S. PATENT DOCUMENTS 4,707,724 * 11/1987 Suzuki et al. .................. 257/666
4,711,700 * 12/1987 Cusack .................. 257/666
5,103,292 * 4/1992 Mahulikar .................. 257/704
5,155,299 * 10/1992 Mahulikar et al. .................. 257/710

FOREIGN PATENT DOCUMENTS 447884   9/1991 (EP).
WO94/11902   5/1994 (WO).

* cited by examiner

Primary Examiner—Mahshid Saadat
Assistant Examiner—Matthew E. Warren
(74) Attorney, Agent, or Firm—Beyer Weaver & Thomas, LLP

(57) ABSTRACT

An ultra-thin composite package for integrated circuits including a metal base with a cavity to support a die with a molded plastic cap cooperating with the base to encapsulate the die. A lead frame having a thinned inner portion or lead tip areas may also be used to further reduce the package thickness. Package thicknesses of about 20 mils (0.5 mm) or less can be readily achieved using this structure combination.

14 Claims, 4 Drawing Sheets

ULTRA-THIN COMPOSITE PACKAGE FOR INTEGRATED CIRCUITS

FIELD OF THE INVENTION

This invention relates generally to ultra-thin packaging for integrated circuits. More particularly, it relates to composite packaging that utilizes a metallic base in combination with a molded plastic cap and in some embodiments, a thinned lead frame.

BACKGROUND OF THE INVENTION

The trend in the electronics industry today is toward higher circuit board densities creating a need for smaller and thinner integrated circuit packages. As the industry gets increasingly into such products as memory cards, smart cards, and Personal Computer Memory Card International Association (PCMCIA) cards, package thickness becomes a critical issue for these and other applications.

The semiconductor industry is presently producing one millimeter Quad Flat Pack (QFP) packages and the demand is growing for even thinner packages. It is becoming increasingly difficult to reduce package thickness substantially more using conventional plastic package structures. This is because plastic packages must inherently contain sufficient material to retain its structural rigidity.

FIG. 1 shows a prior art Quad Flat Pack plastic package 2 with lead frame 4, die 6, die attach pad 8, and wire bonds 10 that are encapsulated in a molded plastic 12 package. Conventional lead frames are typically 6 mils thick, although thinner lead frames have been used. FIG. 2 shows a lead frame assembly 20 prior to encapsulation where the die attach pad 8 is stamped from the same material as the lead frame 4 and supported by corner support arms attached to the lead frame not shown. The plastic material beneath the die attach pad 8 is at least approximately 6 mils thick which brings the thickness of the plastic base to in the range of about 18 to 22 mils. A thin package using this conventional plastic structure is generally about 40 mils thick (about 1 mm).

Another problem with the thicker or larger packages is that they impart larger residual stress on the die due to differing thermal expansion rates of the package material (usually plastic) and lead frame from that of the die. Another disadvantage is that larger packages are more likely to contain moisture after the preheat stage in the manufacturing process, which is not sufficient to drive off all the moisture, thus increasing the possibility of package cracking. What is needed is a thin package structure that avoids these problems and can be used in the applications mentioned above.

SUMMARY OF THE INVENTION

The present invention permits the reduction of package thickness while maintaining structural rigidity by using a composite package structure and in some embodiments, a modified lead frame. A package in accordance with one embodiment of the present invention includes a metal base having a cavity that receives a die, a lead frame electrically connected to the die, and a molded plastic cap that cooperates with the base to encapsulate the die. An electrically insulating layer is positioned between the top surface of the metal base and the lead frame to electrically isolate the lead tips. The metal base is thinner than those used in conventional plastic structures and has a cavity formed therein to receive an integrated circuit die. Also, the cap used is thinner than those of conventional plastic structures which contributes to a overall thinner package.

The use of the metal base provides overall package robustness and gives the necessary support that permits the lead frame to retain its stiffness and integrity. The metal base material can be constructed out of a number of materials that remain structurally rigid at reduced thicknesses. By way of example, materials such as anodized aluminum, Copper Kovar Copper (CKC), or many of the other metals used in the microelectronics packaging industry can be used.

In another embodiment, an even thinner package is achieved by using a modified lead frame in conjunction with the metal base. The lead frame has a multi-thickness configuration where an inner portion or lead tip region (i.e. principally the portion of the lead frame that is under the cap) has a smaller thickness than an outer portion of the lead frame that is outside the cap. The outer portion, (i.e. principally the portion not under the cap), is formed into legs that attach and electrically connect the package to the circuit board.

In a method of the invention, a lead frame is attached to a top surface of a metal base using an adhesive material that electrically insulates the lead frame from the base. A die is inserted into a cavity in the top surface of the metal base and attached thereto. The die is then electrically connected to the lead frame and a plastic cap is formed over the metal base to encapsulate the die and a portion of the lead frame. In a preferred embodiment, a central portion of the lead frame is thinned prior to the attaching step such that the central portion of the lead frame is thinner than an outer portion of the lead frame, wherein the plastic cap covers at least a majority of the thinned central portion of the lead frame.

In addition to providing a thinner package, the present invention has the advantages of reducing package cracking due to moisture and enhancing thermal performance of the package due to the higher thermal conductivity of the metal base. Improved thermal performance of packages increases the operational life of the chip and permits the use of efficient less costly cooling technologies.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE PREFERRED EMBODIMENTS

Figure 1:
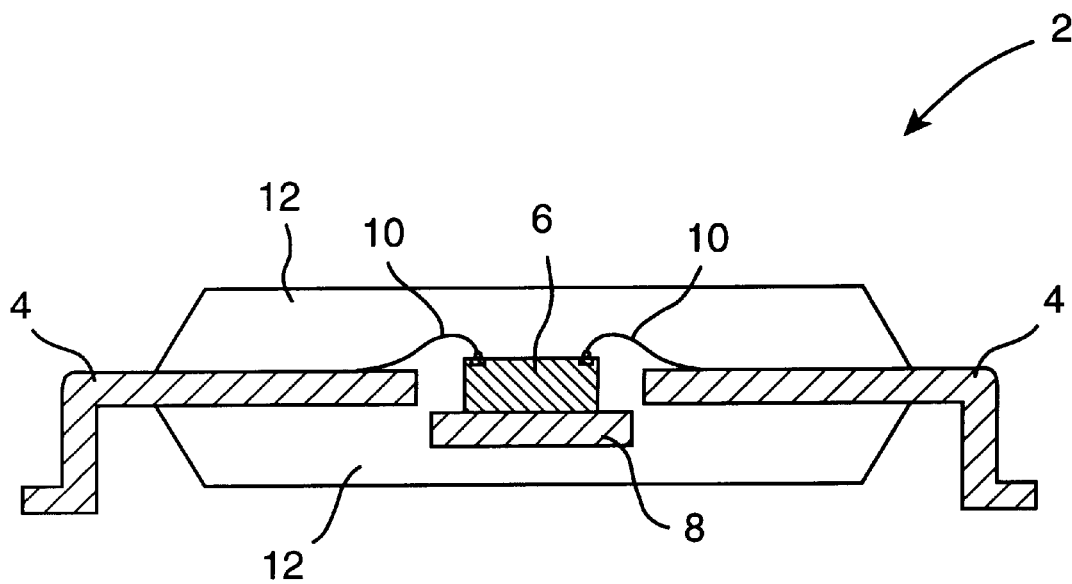
FIG. 1 is a diagrammatic cross sectional side view of a conventional one millimeter plastic package.
Figure 2:
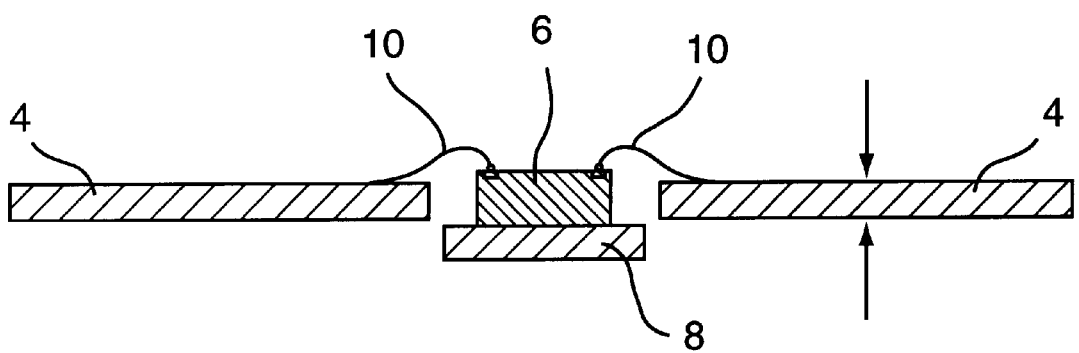
FIG. 2 is a diagrammatic side view of a conventional down set lead frame with a die mounted thereon and electrically connected thereto.
Figure 3:
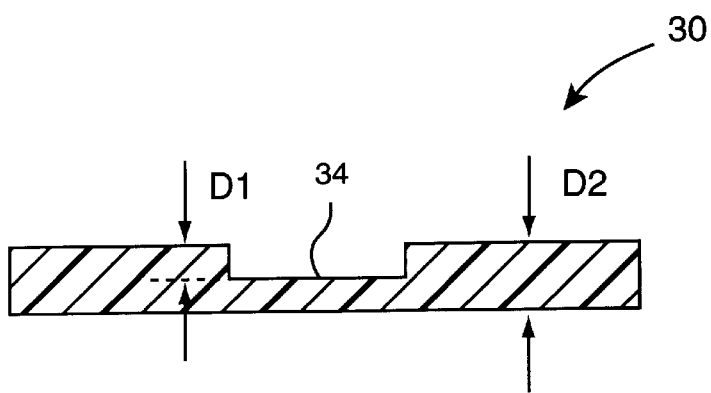
FIG. 3 is a diagrammatic cross sectional side view of a metal base with a die cavity in accordance with one embodiment of the present invention.
Figure 4:
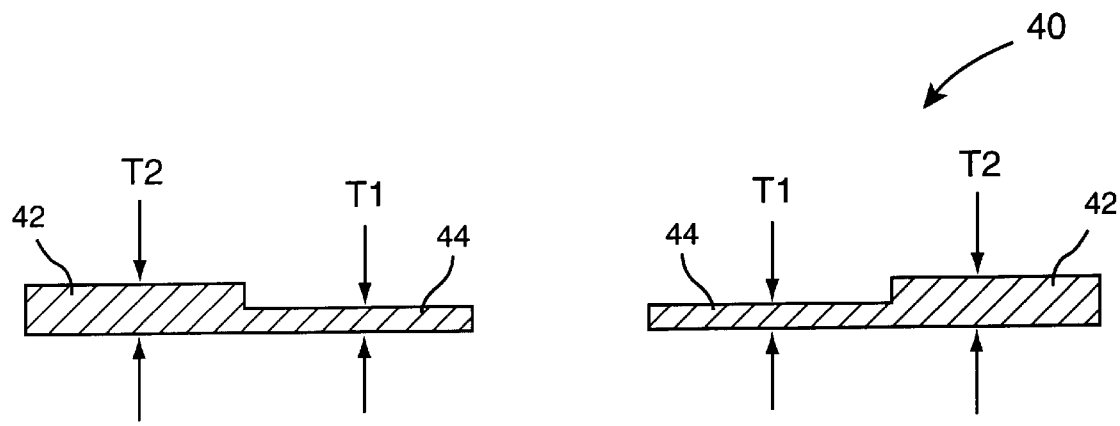
FIG. 4 is a diagrammatic cross sectional side view of a multi-thickness lead frame in accordance with one embodiment of the present invention.
Figure 5:
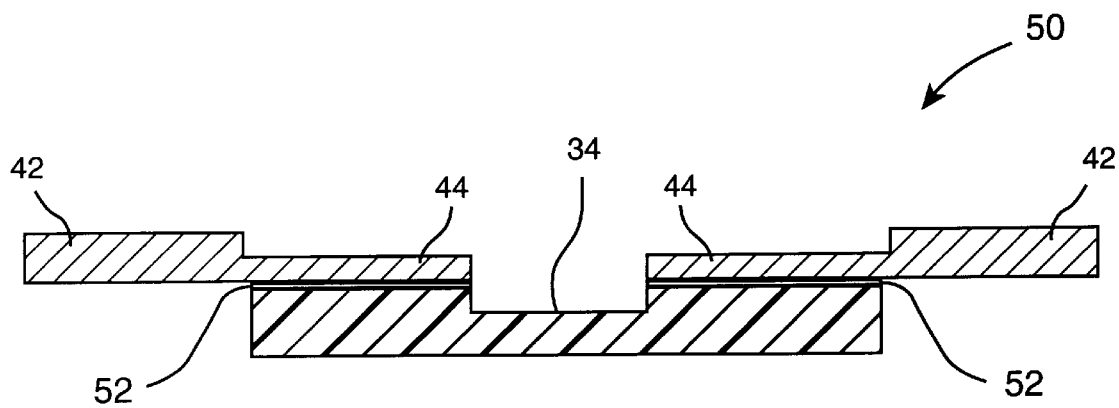
FIG. 5 is a diagrammatic cross sectional side view of the lead frame of FIG. 4 attached to the base of FIG. 3.
Figure 8:
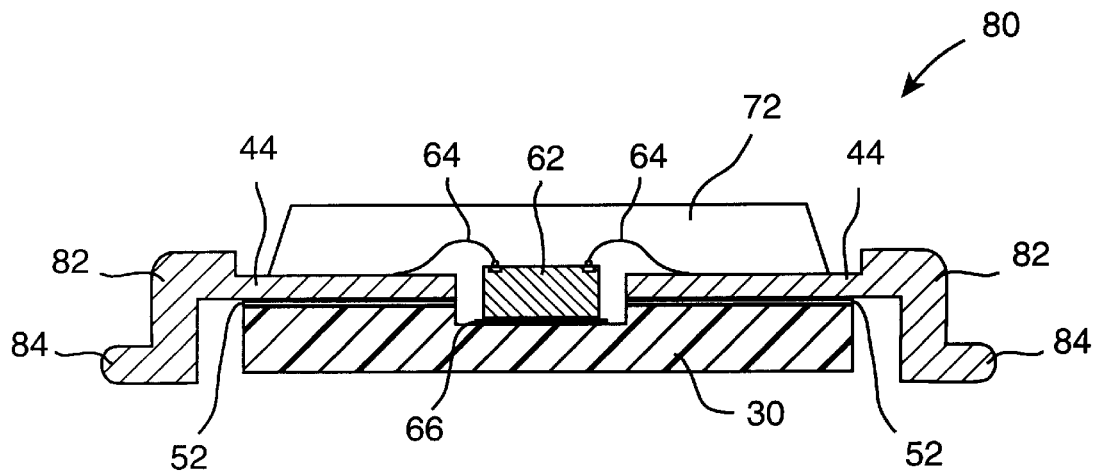
FIG. 8 is a diagrammatic cross sectional side view of a packaged semiconductor in accordance with one embodiment of the present invention.

The following figures referenced to are not drawn to scale but are used to illustrate the general structure of the device. The current discussion and figures are directed toward Quad Flat Pack packages but it should be understood that invention may apply to other types of packages as well. Referring initially to FIG. 8, an ultra thin composite package for integrated circuits in accordance with a first embodiment of the present invention is described. The formed unit includes a metal base 30 having a cavity 34 in its top surface (as best seen in FIG. 3). A lead frame 40 (as best seen in FIG. 4) is attached to the metal base 30 with an insulating layer 52 disposed therebetween. (FIG. 5). An integrated circuit die 62 is positioned in the cavity and affixed using an adhesive material 66. The die 62 is electrically coupled to the lead frame 40 with bonding wires 64 that extend between the bond pads on the die and the tips of the lead frame leads. A cap 72 is then deposited over the die 62, lead tips 44, and wire bonds 64. The cap is typically formed by molding plastic over the assembly and cooperates with the base to form a package that encapsulates the die. The outer portions 42 of the lead frame may then be formed into legs and later attached and electrically connected to a circuit board or other suitable substrate. This approach may be used to create ultra-thin packages where packages having thickness of less than 24 mils are readily obtainable. Thus packages of a half or less the thickness of conventional plastic packages on the market today can be readily made using this structure.

A metal base 30 is depicted in FIG. 3. The base 30 may be formed from any suitable metal material such as anodized aluminum, Copper Kovar Copper (CKC), or other suitable metals used in the semiconductor manufacturing industry. By way of example, anodized aluminum having a thicknesses in the range of 7 to 12 mils as for example 10 mils have been found to work well. The metal base 30 has a cavity 34 in the top surface wherein an integrated circuit die 62 is affixed. This allows a die 62 to be set down into the base and eliminates the need for a die attach pad. There are several ways to create the cavity within the base. For example, the cavity can be created by etching, casting, machining, or any other applicable technique. It has been found that etching works well and is the preferred method used for this embodiment. The depth of the cavity D1 may be varied a great deal in accordance with the needs of a particular embodiment and is generally in the range of about one third to two thirds of the thickness of the metal base D2. By way of example, a cavity depth of about one half the thickness of the base works well when a 10 mil base is used. When the die is mounted directly on the metal base in the described manner, the base has the added benefit of working as a heat spreader.

Figure 7:
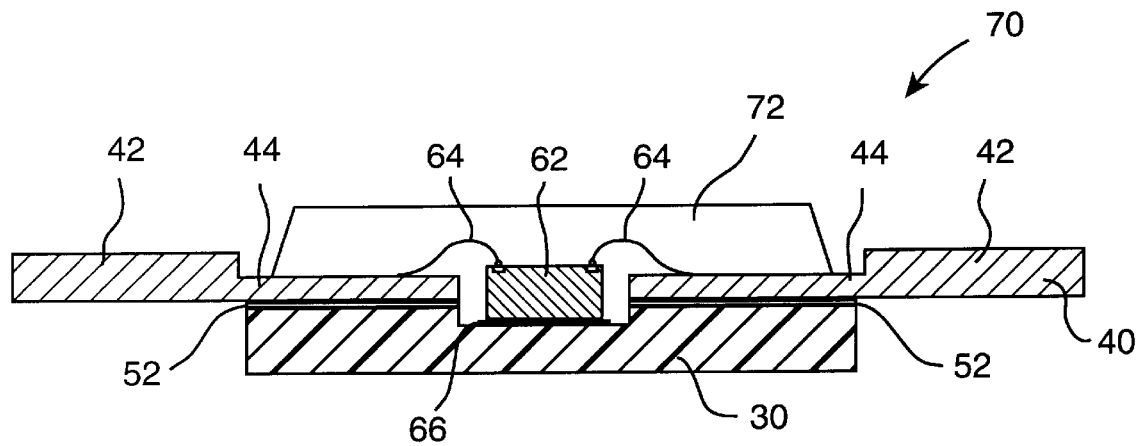
FIG. 7 is a diagrammatic cross sectional side view illustrating the unit of FIG. 6 after a cap that has been formed thereover.

To achieve an even thinner package, a modified lead frame with lead tips of reduced thickness may be utilized together with the metal base. FIG. 4 shows a cross sectional side view of a lead frame 40 in accordance with this embodiment. As seen therein, the lead frame has a thinned inner portion or lead tip area 44 (labeled T1 in figure) that is thinner than an outer portion of the lead frame 42 (labeled T2 on figure). By way of example, the thinned region may be formed by etching the appropriate portion of a uniform thickness blank prior to stamping or etching the leads in the blank. One method suitable for forming the thinned region is disclosed in Harry John Fogelson co-pending application Ser. No. 08/287872, entitled: A Fine Pitch Lead Frame and Method for Manufacturing Same, filed Aug. 9, 1994 which is incorporated herein by reference in its entirety. The thickness of the thinned region T1 can be any suitable fraction of the thickness of the outer region. Generally, it would be in the range of about one third to two thirds of the thickness of the outer region T2. By way of example, when a six mil blank is used an inner region thickness of approximately 3 mils works well. The lead frame 40 may be constructed from any suitable electrically conductive material but is generally formed from copper or a copper alloy. This is because copper has relatively good conductivity and is cost effective. As best seen in FIGS. 7 & 8, in the preferred embodiment shown, the inner portion or lead tips 44 is principally the portion that will eventually be covered by the plastic cap 72 and the outer portion 42 is principally that part outside the cap. However, the thinned region could extend further outside of the cap region or the thick region could extend under the cap. An advantage of the structure shown is that good quality cap molding can be obtained with a minimum overall package thickness using this structure.

FIG. 5 shows the lead frame of FIG. 4 attached to the metal base of FIG. 3. An insulating layer 52 is formed between the top surface of the metal base 30 and the lead frame 40. The insulating layer may be any conventional lead frame insulating material such as an insulative polyimide tape or a non conducting epoxy. Thus, the insulating layer 52 electrically isolates the lead tips from the metal base. Using insulative tape or non conducting epoxy also serves to permanently secure and seal the lead frame to the base. The base provides structural support to the thinned region of the lead frame so that fastened, the lead frame is sufficiently rigid. The electrically insulating layer may be formed in other conventional manners as well. By way of example, when an aluminum base is used, oxidized insulative layer can be formed to accomplish the task of providing electrical isolation between the lead tips and the metal base.

Figure 6:
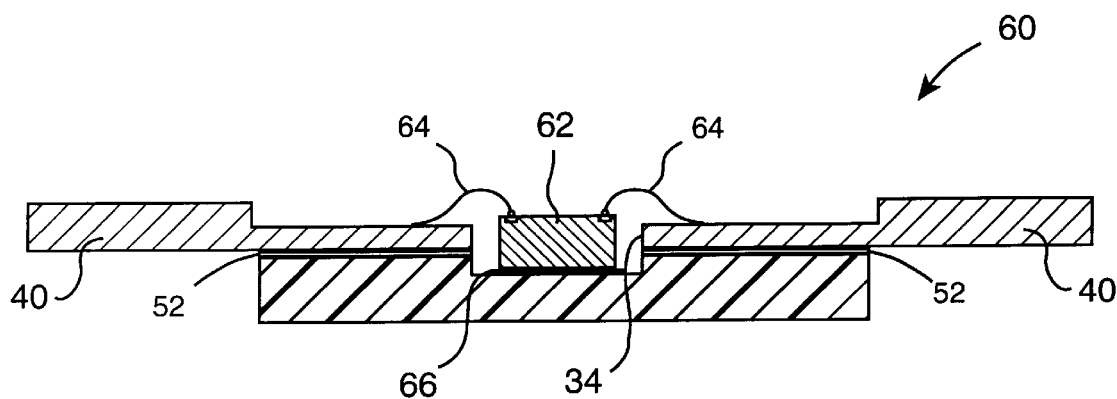
FIG. 6 is a diagrammatic cross sectional side view illustrating a die that has been wire bonded and affixed to the unit of FIG. 5.

FIG. 6 shows the unit of FIG. 5 with an integrated circuit die 62 positioned in the cavity 34 of the base 30 and affixed with an adhesive material 66. The adhesive material 66 can be thermally conductive to improve heat conduction from the die 62 to the metal base 30 as required by any particular application. In such a case, the metal base has the duel function of acting as a heat spreader. In this embodiment, the die 30 is electrically coupled to the lead frame 40 using a wire bonding technique through the use of bonding wires 64 but it should be noted that other conventional bonding methods such as tape automated bonding (TAB) are possible. Bonding wires 64 are made of a conductive material such as gold because of its good conductivity and ability to bond well to the silver plating on the bonding pads. The wire bonding technique is well known to those skilled in the art and is widely used in the industry today. The distance the bonding wires extend up above the die before it swings back down to the lead tips is referred to as the wire loop height which typically extends up to about 4 to 5 mils above the die.

FIG. 7 shows a cross sectional view of the unit of FIG. 6 with a cap 72 formed over the unit that joins with the base 30 and lead frame 40 to encapsulate the die. In the embodiment shown, the cap is an injection molded plastic that covers the die, lead tips, and wire bonds to seal the package. Alternatively, the cap material can be ceramic, metal, or any other suitable material. Plastic has the advantages of being relatively straight forward to apply using an injection molding process and is relatively cost effective. The plastic molds over and bonds with the lead frame and base to form a combined seal to encapsulate the die. It has been found that in making this seal, plastic adheres to copper quite well but that it does not adhere as well to aluminum. One solution is to plate the surface of the metal with a metal that results in better adhesion to the plastic. Other methods of treating the surface may also be used to insure a good quality bond. The thickness of the cap may vary to a great extent in accordance with the needs of a particular system. By way of example, thicknesses in the range of approximately 6 to 12 mils, which is thinner than that of plastic top portions in most conventional plastic packages work well and when combined with the dimensions of the other package components permit substantially smaller package dimensions to be achieved than are possible with standard plastic packages.

FIG. 8 shows a cross sectional view of the formed unit in FIG. 7 where the outer portion of lead frame is formed into legs 82 that attach and electrically connect the package to the circuit board. The illustrated legs are formed with feet 84 for surface mount applications but can be readily formed without the feet for through hole mount applications as well. The legs and feet are formed such that the package standoff, distance from the bottom of the package to the circuit board, is as small as possible to minimize post mounting package height. The described package structure can be quite small. As indicated above, package thickness of a half a millimeter and under are readily attainable. By way of example, for a conventional die having a thickness on the order of 6–8 mils, a base thickness in the range of 7–12 mils work well. Thinned lead frames on the order of 3 mils in the thinned regions also work well. Plastic cap thickness in the range of 6–12 mils also work well. Of course, the plastic cap must be sufficient to comfortably cover the tops of the bonding wire when bonding wires are used. One specific example includes a base having a thickness of 10 mils with a 5 mil cavity. A 6 mil lead frame having a thickness of three mils in the thinned range. Using bonding wires with a maximum loop height of 4 to 5 mils and a die having a thickness in the range of approximately 6 to 8 mils, the molded plastic cap may have a height in the range of about 7 to 10 mils resulting in a cumulative package thickness in the range of 20 to 22 mils. As will be appreciated by those skilled in the art, such a package has a number of desirable features.

Figure 9:
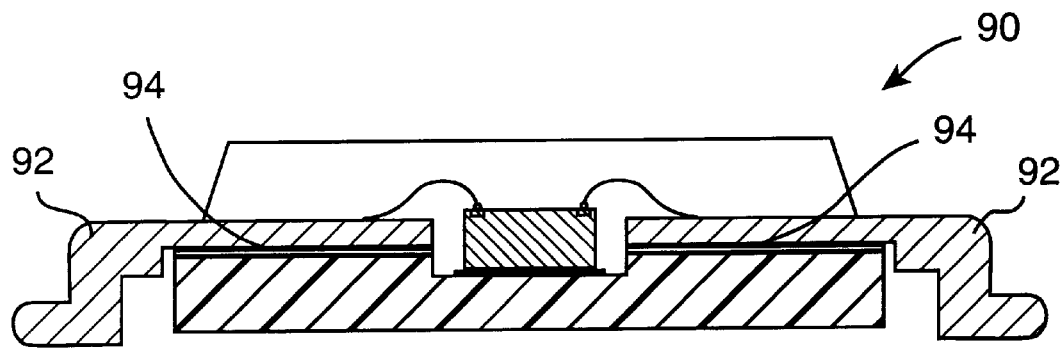
FIG. 9 illustrates a second embodiment of the present invention.
Figure 10:
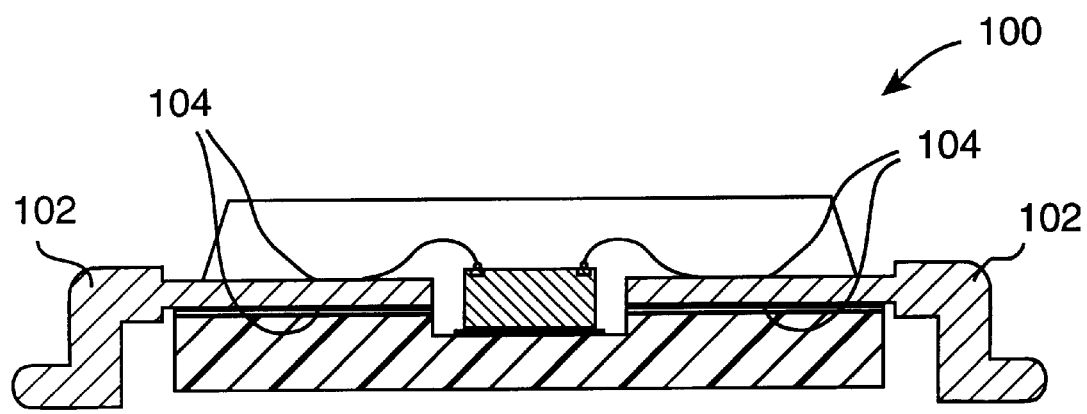
FIG. 10 illustrates a third embodiment of the present invention.

Referring next to FIG. 9 an alternative package 90 utilizing a slightly different lead frame geometry will be described. The lead frame 92 is attached in a reversed position with the etched surface 94 of the lead tips attached to the base 30. Another embodiment using a different modified lead frame is shown in FIG. 10. The lead frame 102 has a lead tip thickness of 3 mils and outer portion of 6 mils whereby the lead tip portion is etched on both surfaces 104. Both, configurations yield a functionally equivalent working packages. There are several lead frame variations that can be employed to achieve the similarly functional results and it is within the scope of this description to include all such variations.

While this invention has been described primarily in terms of a Quad Flat Pack package, it should be understood that the invention can be applied to other types of packages as well. The described device may also be constructed from different materials than those described herein, such as substituting ceramic, or some such similarly appropriate material for the cap or using a different material for the base, for example. Similarly, alternative embodiments such as using a multi-cavity base and an appropriately modified lead frame to support multiple integrated circuit dies in a single ultra-thin multi-chip package or multi-chip module is also within the scope of the invention. Therefore, the present examples are to be considered as illustrative and not restrictive, and the invention is not to be limited to the details given herein, but may be modified within the scope of the appended claims.

What is claimed is:
1. A semiconductor device package, comprising:
    (a) a metal base having a top surface and a cavity formed in the top surface;
    (b) a lead frame having a plurality of leads, the lead frame being supported by the top surface of the base;
    (c) an insulating layer positioned between the lead frame and the top surface of the base, the insulating layer being arranged to electrically insulate the lead frame from the base;
    (d) an integrated circuit die received within the base cavity and electrically coupled to the lead frame;
    (e) a plastic cap molded over the top surface of the metal base, the die and an inner portion of lead frame, the cap cooperating with the base to encapsulate the die wherein the plastic cap is in direct contact with the integrated circuit die; and
    (f) wherein the lead frame includes a lead tip portion having a first thickness that is under the cap and a pin portion having a second thickness that is outside the cap, the lead tip portion being thinner than the pin portion.

2. A semiconductor device as recited in claim 1 wherein the lead tip portion is approximately 3 mils thick and the pin portion is approximately 6 mils thick.

3. A semiconductor device package as recited in claim 1 where the lead frame is formed from copper or a copper alloy.

4. A semiconductor device package as recited in claim 1 wherein the metal base is formed from anodized aluminum.

5. A semiconductor device package as recited in claim 1 wherein the metal base thickness is less than or equal to approximately 12 mils.

6. A semiconductor device package as recited in claim 1 wherein the depth of the cavity is at least half the thickness of the metal base.

7. A semiconductor device package as recited in claim 1 wherein the bonding wire loop height extends 4 to 5 mils above the top of the die surface.

8. A semiconductor device package as recited in claim 5 wherein the die thickness is in the range of approximately 6 to 10 mils.

9. A semiconductor device package, comprising:
    (a) a metal base having a top surface and a cavity formed in the top surface, wherein the metal base thickness is less than or equal to approximately 12 mils;
    (b) a lead frame having a plurality of leads, the lead frame being supported by the top surface of the base;
    (c) an insulating layer positioned between the lead frame and the top surface of the base, the insulating layer being arranged to electrically insulate the lead frame from the base;
    (d) an integrated circuit die received within the base cavity and electrically coupled to the lead frame, wherein the die thickness is in the range of approximately 6 to 10 mils;
    (e) a plastic cap molded over the top surface of the metal base, the die and an inner portion of lead frame, the cap cooperating with the base to encapsulate the die wherein the plastic cap is in direct contact with the integrated circuit die and wherein the molded plastic cap is in the range of approximately 6–12 mils thick.

10. A semiconductor device package as recited in claim 1 wherein bonding wires electrically couple the die to the lead frame.

11. A semiconductor device package as recited in claim 1 wherein the second thickness is completely outside the cap.

12. A semiconductor device package as recited in claim 11 wherein the first thickness is completely under the cap.

13. A semiconductor device package, comprising:

(a) a metal base having a top surface and a cavity formed in the top surface;

(b) the lead frame having a plurality of leads, the lead frame being supported by the top surface of the base and including a lead tip portion having a first thickness and a pin portion having a second thickness, the lead tip portion being thinner than the pin portion;

(c) an insulating layer positioned between the lead frame and the top surface of the base, the insulating layer being arranged to electrically insulate the lead frame from the base;

(d) an integrated circuit die received within the base cavity and electrically coupled to the lead frame;

(e) a cap molded directly over the top surface of the metal base, the die and an inner portion of lead frame having the first thickness, the cap being arranged such that the cap does not overlap any portion of the lead frame having the second thickness, the cap cooperating with the base to encapsulate the die.

14. A semiconductor device package as recited in claim 13 where lead tip portion is approximately 3 mils thick and the outer portion is approximately 6 mils thick.

* * * * *